United States Patent [19]
Tsang et al.

[11] Patent Number: 6,164,781
[45] Date of Patent: Dec. 26, 2000

[54] HIGH TEMPERATURE TRANSISTOR WITH REDUCED RISK OF ELECTROMIGRATION AND DIFFERENTLY SHAPED ELECTRODES

[75] Inventors: Joseph Cheung-Sang Tsang, Ellicott City; John Burt McKitterick, Columbia, both of Md.

[73] Assignee: AlliedSignal Inc., Morristown, N.J.

[21] Appl. No.: 09/192,155

[22] Filed: Nov. 13, 1998

[51] Int. Cl.$^7$ .................................................. H01L 29/00
[52] U.S. Cl. ......................... 357/347; 257/348; 257/349; 257/350; 257/351; 257/352; 257/353; 257/354; 257/355; 257/382; 257/383; 257/384
[58] Field of Search ................................... 257/382–384, 257/347–355

[56] References Cited

U.S. PATENT DOCUMENTS

| | | | |
|---|---|---|---|
| 3,745,426 | 7/1973 | Olmstead | 317/235 |
| 5,258,638 | 11/1993 | Elhatem et al. | 257/401 |
| 5,587,597 | 12/1996 | Reedy et al. | 257/351 |
| 5,644,121 | 7/1997 | Nakano et al. | 250/208.1 |
| 5,681,761 | 10/1997 | Kim | 437/21 |

FOREIGN PATENT DOCUMENTS 0 421 735 A2   4/1991   European Pat. Off. .

OTHER PUBLICATIONS

W. Krull et al, "Demonstration of the Benefits of SOI for High–Temperature Operation," Proc. 1988 IEEE International SOS/SOI Technology Workshop,. Conference, p. 69.

W.P. Maszara., "SOI by Wafer Bonding: A Review," 4th International Symposium on SOI Technology and Devices, Proc. ECS, D.N. Schmidt editor, v90 (6), p. 199, 1990.

W.P. Maszara et al., "An SOI Smart–Power Solenoid Driver for 300 Degrees C Operation," GOMAC Conference, Orlando, FL, Mar. 1996.

G. Goetz et al., "Chromium Refractory Metal Allows Conductors for Use in High–Temperature Integrated Circuits," Invention Disclosure # 450–95–001 (10%CR/W).

G. Goetz et al., "Low Resistivity Thin–Film Conductor for High–Temperature Integrated Circuit Electronics," Invention Disclosure # 450–95–003 (2%Cr/Au).

G. Goetz et al., "Alloys of CrMo for Conductors and Contacts in High–Temperature IC's," Invention Disclosure # 450–96–006.

G. Goetz et al., "Aluminum Alloy High–Temperature IC Conductors," Invention Disclosure # 450–97–001 (2%TI/Ai or 2%W/AI).

Patent Abstracts of Japan, vol. 015, No. 434 (E–1129), Nov. 6, 1991 (1991–11–06),& JP 03 180073 A (Miyai Kogyo Koutou Senmon Gatsukouchiyou), Aug. 6, 1991 1991–08–06 abstract.

*Primary Examiner*—Fetsum Abraham
*Attorney, Agent, or Firm*—Loria B. Yeadon

[57] ABSTRACT

Electromigration in the source and drain conductors of a semiconductor device is reduced by increasing the cross-sectional areas of these conductors in accordance with an increase in a magnitude of current, thereby enabling the semiconductor device to operate at high temperatures.

20 Claims, 3 Drawing Sheets

HIGH TEMPERATURE TRANSISTOR WITH REDUCED RISK OF ELECTROMIGRATION AND DIFFERENTLY SHAPED ELECTRODES

GOVERNMENTAL INFORMATION

The U.S. Government has a paid-up license in this invention and the right in limited circumstances to require the patent owner to license others on reasonable terms of agreement number F33615-96-2-2618 awarded by United States Air Force, Air Force Material Command.

BACKGROUND OF THE INVENTION

1. Field of the Invention

The present invention relates to semiconductor structures and, more particularly, to a high temperature semiconductor device and a method of manufacturing the device.

2. Description of the Related Art

Semiconductor devices are versatile and are used in many applications in many different industries. However, many applications that could more fully benefit from the use of semiconductor devices have been precluded from their use due to harsh operating environments. For example, industrial environments where high temperatures are experienced.

A demand exists in aerospace, automotive and other industries for high temperature control and power electronics, which can be mounted very, close in proximity to a heat source, such as, a combustion chamber for an internal combustion engine. By providing a high temperature integrated circuit or semiconductor device many discrete components may be replaced by a single chip. In this way, a more compact and lightweight device may be implemented with less fasteners and electrical wires. Further, integrated semiconductor devices provide more intelligent functions and programming capability. The smaller size and less maintenance required for integrated semiconductor devices aids in reducing costs as well.

Bulk silicon semiconductor devices are impractical for high temperature applications, i.e., greater than 175° C. This is due to device leakage current for the bulk silicon device which doubles for every 8° C. increase in temperature. In contrast silicon-on-insulator (SOI) technology devices have been demonstrated to produce functional devices up to about 400° C. However, despite operational benefits of SOI technology, high temperature devices suffer from increased likelihood of electromigration failures.

Referring to FIG. 1, a conventional layout of a semiconductor device 10 is shown having arrows representing currents. The arrow size, indicated in FIG. 1, is proportional to the magnitude of the current at the various locations on device 10. Device 10 includes gate structures 12 and metal lines 14. Below metal structures are diffusion regions (not shown) common to semiconductor transistor devices. During operation currents are generated in device 10 as indicated. In a high temperature application electromigration failures occur in places where the current density is highest. Therefore, a highest probability of electromigration failure will occur in regions 16, 18 and 20 at the ends of device 10.

Therefore, a need exists for a semiconductor device that may be 5 used under high temperature conditions. A further need exists for a semiconductor device that reduces the risk of electromigration failures despite high temperature operation.

SUMMARY OF THE INVENTION

A semiconductor device, in accordance with the present invention, includes a source region and a drain region disposed on opposite sides of a gate structure. A source conductor is disposed over and is electrically connected to the source region, and a drain conductor is disposed over and is electrically connected to the drain region. The source and drain conductors are disposed on opposite sides of the gate structure. The source conductor has a narrow end portion on a first side and gradually widens to a wide end portion on a second side. The drain conductor has a narrow end portion on the second side and gradually widens to a wide end portion on the first side. The gradual widening of the source and drain conductors provides an increasing cross sectional area in accordance with an increase in a magnitude of current flow. The current flow is generated by activation of the gate structure.

Another semiconductor device includes a plurality of alternating source and drain regions. Each of the plurality of regions is disposed on opposite sides of a gate structure. A plurality of source and drain conductors is included, each conductor being electrically connected to one of a corresponding source region and a corresponding drain region. The source and drain conductors include a same gradually widening shape as the corresponding source regions and the corresponding drain regions, the gradually widening shape for drain regions widening in a first direction and the gradually widening shape for source regions widening in a second direction opposite the first direction. The gradually widening shape increases cross sectional areas of the source and drain conductors in accordance with an increase in a magnitude of current flow. The current flow is generated by activation of the gate structure.

A silicon-on-insulator semiconductor device includes a plurality of alternating source and drain regions, each of the plurality of regions disposed on opposite sides of a gate structure. A plurality of source and drain conductors is also included, each conductor being electrically connected to one of a corresponding source region and a corresponding drain region by a contact. Each source and drain conductor is separated by the gate structures. The source and drain conductors have a substantially constant thickness and have a same gradually widening shape as the corresponding source regions and the corresponding drain regions. The gradually widening shape for drain regions widens in a first direction and the gradually widening shape for source regions widens in a second direction opposite the first direction. The gradually widening shape increases cross sectional areas of the source and drain conductors in accordance with an increase in a magnitude of current flow. The current flow is generated by activation of the gate structure.

In alternate embodiments, the source and drain conductors are preferably substantially trapezoidal in shape. The gate structures may have a length sufficient to generate currents in the source and drain conductors of between about 300 mA to about 5 A. The device is preferably a silicon-on insulator structure. The device is preferably operable at temperatures above about 175 degrees Celsius. The source and drain conductors may include aluminum.

The wide end portions of the source and drain conductors may correspond to one of current flow entrance regions and current flow exit regions. The gate structures have a length that is preferably skewed by between 60 degrees to less than 90 degrees from edges of a device region. The devices are preferably field effect transistors (FETs) and preferably DMOS (double diffused metal oxide semiconductor) FETs.

These and other objects, features and advantages of the present invention will become apparent from the following detailed description of illustrative embodiments thereof, which is to be read in connection with the accompanying drawings.

BRIEF DESCRIPTION OF THE DRAWINGS

The invention will be described in detail in the following description of preferred embodiments with reference to the following figures wherein.

DETAILED DESCRIPTION OF PREFERRED EMBODIMENTS

The present invention relates to semiconductor structures and, more particularly, to a high temperature semiconductor device. The present invention employs the high temperature capability offered by silicon-on-insulator (SOI) technology and provides the same or better reliability as commercially available devices suitable for lower temperature. Metal and diffusion regions for the device in accordance with the invention are advantageously trapezoidal in shape. Areas of current flow are thereby adjusted to reduce current density to reduce the risk of electromigration failures. The present invention is preferably implemented using SOI technology but may be applied to bulk silicon technology as well. The present invention will be described in terms applicable to a SOI DMOS (double diffused metal oxide semiconductor) transistor for illustrative purposes only and the device is not intended to limit the applicability of the invention.

Figure 2:
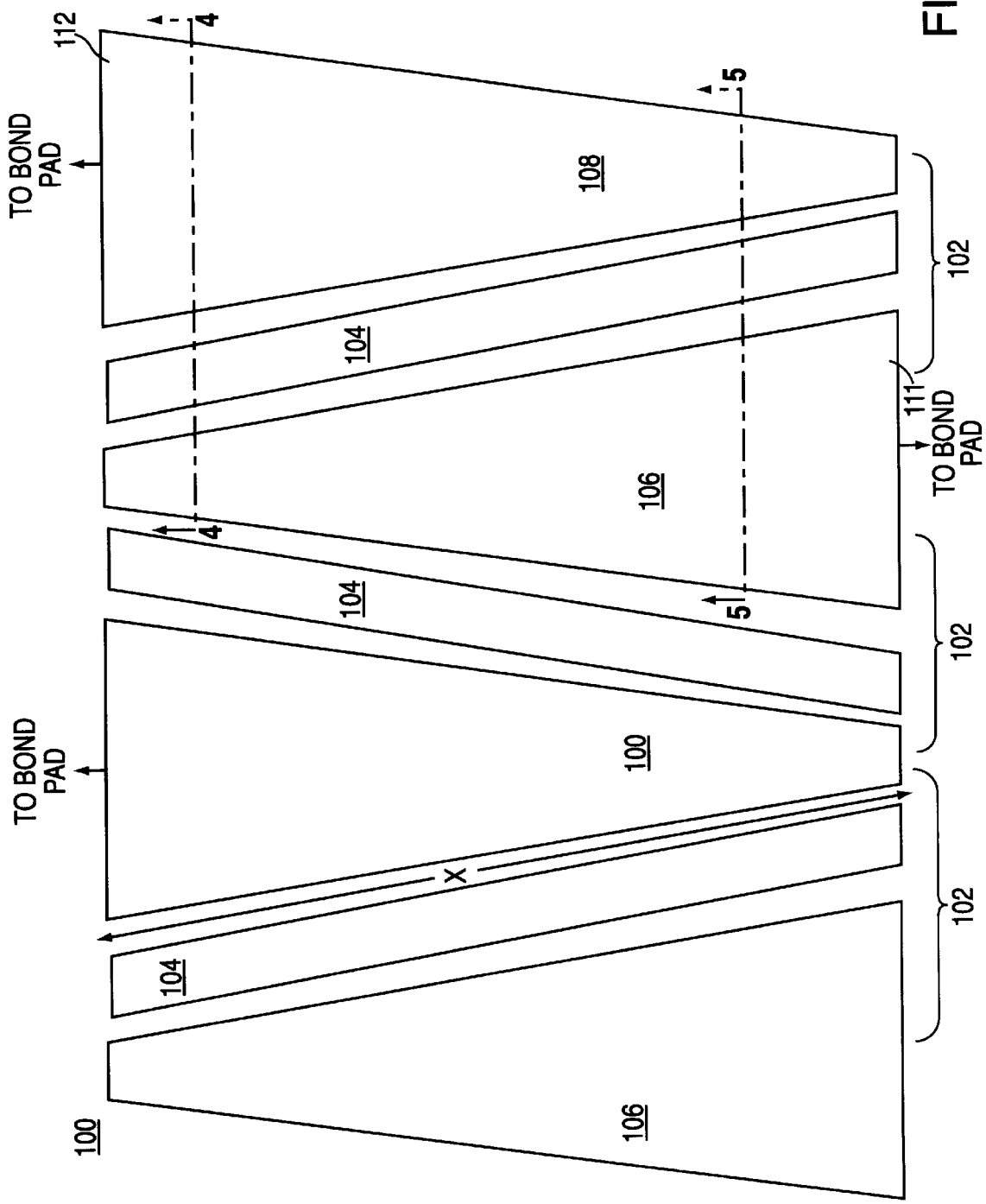
FIG. 2 is a top plan view of a layout of a semiconductor device in accordance with the present invention showing alternating source and drain conductors having a trapezoidal shape.

Referring now in specific detail to the drawings, where like numerals represent the same or similar elements and initially to FIG. 2, a top view of a semiconductor device 100 is shown in accordance with the present invention.

Device 100 includes transistors 102, which may include bulk silicon or silicon-on-insulator (SOI) technology. Transistors 102 preferably include SOI technology for use with high temperature applications, i.e. for temperatures above 175° C. and more preferably above 300° C. Transistors 102 adapted for use for high voltage applications may include double diffused metal oxide (DMOS) semiconductor transistors, however, normal complementary metal oxide semiconductor (CMOS) transistors are also contemplated. Transistors 102 include a gate 104, a source conductor 106 and a drain conductor 108. Source conductor 106 and drain conductor 108 correspond to source and drain diffusion regions therebelow. Gates 104 connect to bond pads (not shown) on device 100 to enable conduction between sources and drains. Source conductor 106 and drain conductor 108 connect to bond pads (not shown) to provide appropriate connections to device 100 for operation.

Figure 4:
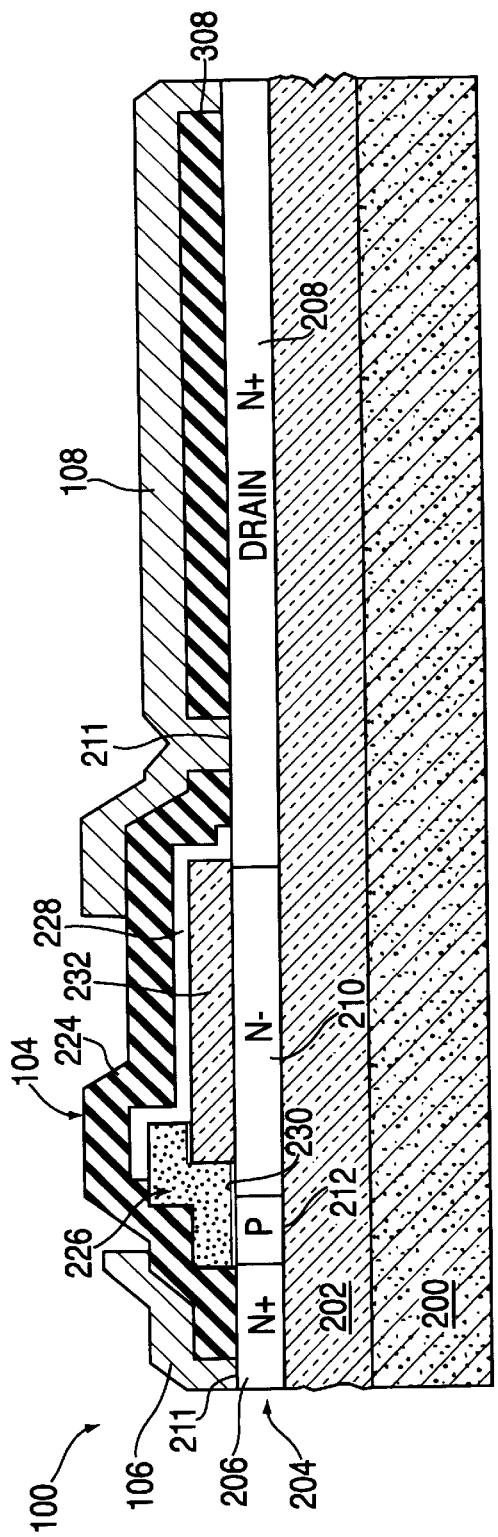
FIG. 4 is a cross-sectional view taken along section line 4—4 of the semiconductor device of FIG. 2 in accordance with the present invention.
Figure 5:
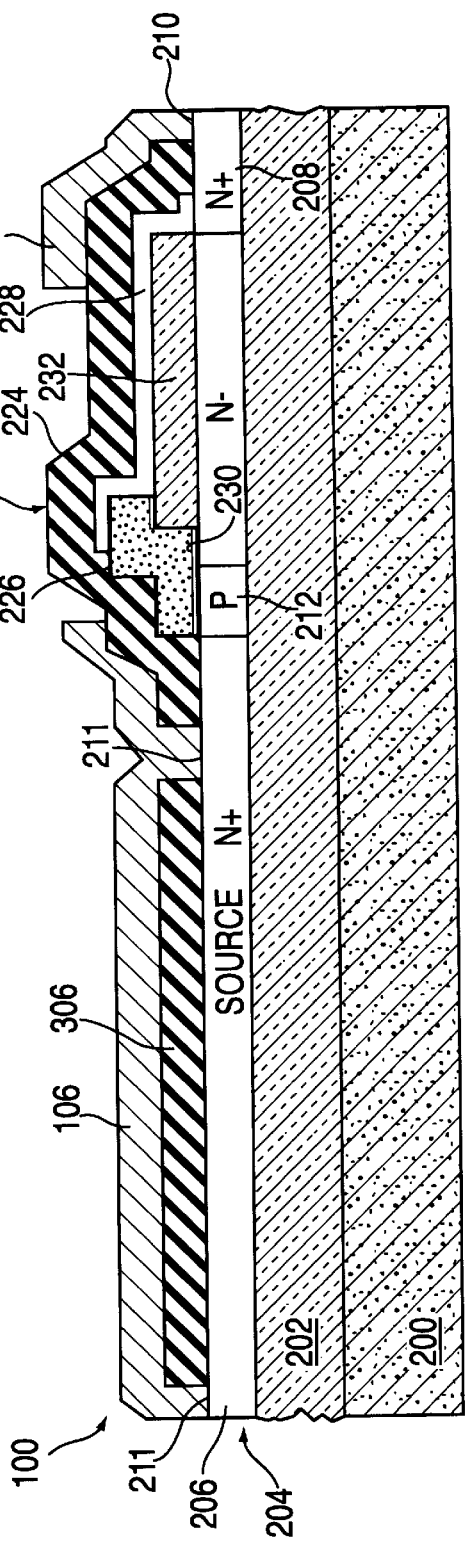
FIG. 5 is a cross-sectional view taken along section line 5—5 of the semiconductor device of FIG. 2 in accordance with the present invention.

Source diffusion region 206 is located below source conductor 106. Drain diffusion region 108 is located below drain conductor 108. These diffusion regions are shown in FIGS. 4 and 5. FIG. 2 shows alternating source conductor 106 and drain conductor 108 regions to conserve layout area. Alternating source conductors 106 and drain conductors 108 are shared between adjacent transistors 102 as indicated. Other configurations are contemplated as well for the present invention.

Figure 1:
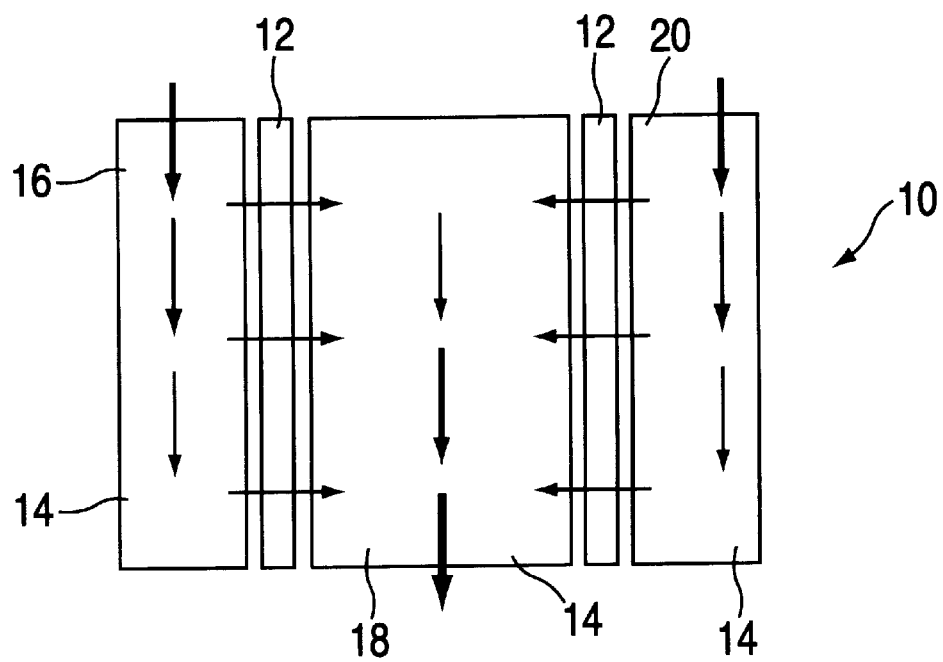
FIG. 1 is a top plan view of a conventional layout of a semiconductor device showing current magnitudes through metal lines.
Figure 3:
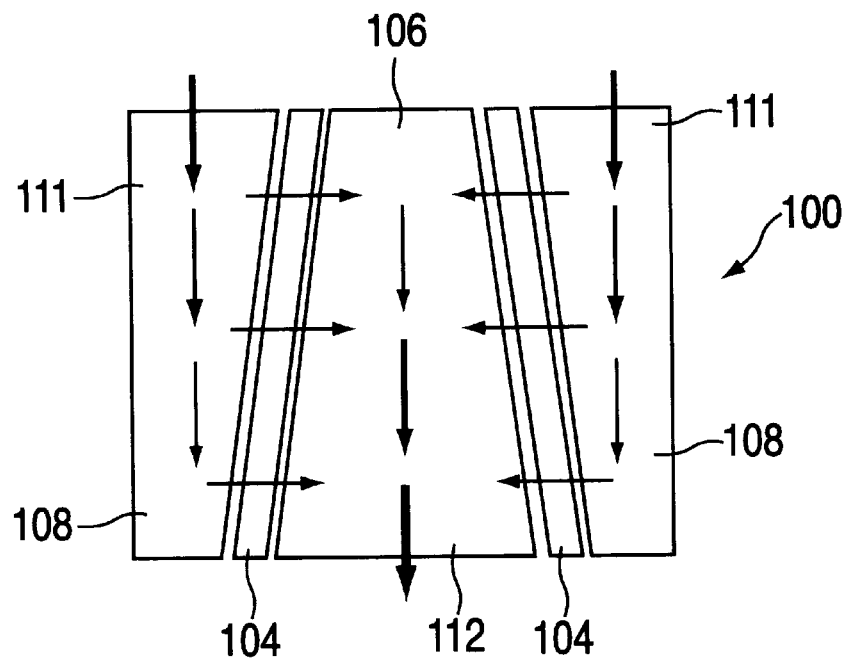
FIG. 3 is a top plan view of a layout of a semiconductor device in accordance with the present invention showing current magnitudes through source and drain conductors.

According to the present invention, source conductors 106, drain conductors 108, and their corresponding diffusion regions therebelow, are substantially trapezoidal in shape. Advantageously, the trapezoidal shape provides for increased cross sectional area for current flow, thereby reducing current density therethrough. Since the allowable current density in source conductors 106 and drain conductors 108 is directly proportional to the cross-sectional area of these conductors, where currents are increased, the cross-sectional area is increased as shown in FIG. 3. For device 100 in FIG. 3 arrows representing currents are shown. The arrow size indicated in FIG. 3 is proportional to the magnitude of the current at the various locations in source conductor 106 and drain conductor 108. Risk of electromigration of source conductor 106 and drain conductor 108 is thereby greatly reduced according to the present invention. FIGS. 2 and 3 show wider source conductors 106 and drain conductors 108 where currents exit and enter these conductors. Entrance region 111, associated with source conductor 106, and exit region 112, associated with drain conductor 108, represent higher magnitude currents and therefore are wider to provide a constant or decreased current density along source conductor 106 and drain conductor 108. Further, since a minimum cross sectional area is to be met for operating currents through source conductor 106 and drain conductor 108 to provide adequate protection from electromigration, the trapezoidal shape of these conductors reduces layout area of device 100 by as much as about 22 %, although higher reductions may be achieved. In preferred embodiments, gates 104 are oriented as indicated by an angle to obtain the trapezoidal shape for source conductor 106 and drain conductor 108. This angle is preferably between about 60 degrees to about 90 degrees depending on the allowable current density and design criteria.

In one embodiment of the present invention, device 100 is used in a high temperature environment and is a power field effect transistor. For this application, to supply a load with sufficient power, high currents may be developed on device 100. The need for high currents translates to longer gates 104. The length of gates is indicated by an "x" in FIG. 2. The length of gates 104 is proportional to the delay of the gate which may be represented by $x^2 rc$, where x is the length, r is the resistance of the gate per unit length and c is the parasitic capacitance of the gate per unit length. The present invention permits longer gates by reducing risk of electromigration failures. In this way, higher currents can be developed and power field effect transistors may be realized for powering discrete devices such as a motor or an actuator. Device 100 preferably generates currents between from about 300 mA to about 5 A depending on gate length.

Referring to FIGS. 4 and 5, cross-sectional views at section lines 4—4 and 5—5 of FIG. 2 are shown. FIGS. 4 and 5 show a SOI DMOS transistor structure for device 100, however other structures may also be implemented in accordance with the invention. Device 100 includes a substrate 200, preferably a monocrystalline silicon substrate. In one embodiment, substrate 200 is preferably a portion of a silicon-on-insulator (SOI) structure. A buried dielectric layer 202 is provided on substrate 200, buried dielectric layer 202 preferably includes an insulator such as a silicon oxide. A silicon layer 204 is provided on dielectric layer 202. Silicon layer 204 is doped to provide a source diffusion region 206, drain diffusion region 208, a drift region 210 and a channel diffusion region 212. As illustrated in FIGS. 4 and 5, source diffusion region 206 and drain diffusion region 208 have varied widths as indicated. Source conductor 106 and drain conductor 108 respectively correspond to source diffusion region 206 and drain diffusion region 208 and are likewise increased and decreased in width in accordance with the diffusion regions. Source conductor 106 and drain conductor 108 are electrically connected to source diffusion region 206 and drain diffusion region 208 by contacts 211, which preferably extend the length (i.e., into and out of the page) of source conductor 106 and drain conductor 108. Contacts 211, source conductors 106, and drain conductors 108 (FIG. 2) are preferably formed of a metal such as aluminum and for high temperature applications aluminum may be alloyed with titanium and/or tungsten, further alloys including chromium and molybdenum may be used.

Source conductor 106 and source diffusion region 206 have a source dielectric layer 306 therebetween. Drain conductor 108 and drain diffusion region 208 have a drain dielectric layer 308 therebetween. Both the source dielectric layer 306 and the drain dielectric layer 308 also provide a gate cap layer 224 for electrically isolating gate structure 104. Gate structure 104 includes a conductive material 226, preferably polysilicon or doped polysilicon. Conductive material 226 is isolated from drift region 210 and channel diffusion region 212 by a gate oxide 230. A second conductive material not shown, preferably on a block oxide 228 is included electrically connecting to conductive material 226. Conductive material 226 and second conductive material are separated from drift region 210 by a field oxide layer 232.

During operation, gate structure 104 is activated through bond pads (not shown). Voltage is applied to conductive material 226 and the second conductive material. The voltage creates a field, which forms a channel in channel diffusion region 212 and in drift region 210. Drift region 210 provides a voltage standoff function when, for example, device 100 is used in a power circuit including a motor (not shown). When the device and therefore the motor are switched off, a relatively large voltage potential may still be applied to drain diffusion region 208. Drift region 210 protects device 100 from possible damage during this condition.

The thickness of buried dielectric layer 202, the length (between source and drain) of drift region 210, doping profiles and gate oxide 230 thickness are determined by the particular application of device 100. For example, a higher source-drain breakdown voltage, such as 28 volts, necessitates a longer drift region 210 and thicker buried dielectric layer 202. Likewise, a heavier doped channel diffusion region 212 creates a higher MOS threshold voltage for high temperature applications in accordance with the present invention.

Additional metal layers and dielectric layers may be introduced onto the structures of FIGS. 4 and 5. It is desirable to provide additional metal layers in the same trapezoidal shapes as source conductor 106 and drain conductor 108. This advantageously avoids overlap of conductive regions in different layers, a condition that may introduce parasitic capacitances.

In other embodiments of the present invention, other shapes may be provided for conductive regions and corresponding source and drain diffusion regions. Other shapes are contemplated and are only limited by the fabrication process capabilities. It is to be understood that increasing the thickness of the conductive regions to further increase the area thereof may provide additional electromigration reduction. However, substantially constant thickness conductive regions are preferred.

Having described preferred embodiments of high temperature transistor with reduced risk of electromigration (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A semiconductor device comprising:
    a source region and a drain region disposed on opposite sides of a gate structure;
    a source conductor disposed over and electrically connecting to the source region and a drain conductor disposed over and electrically connecting to the drain region, the source conductor and drain conductor disposed on opposite sides of the gate structure; and
    the source conductor having a narrow end portion on a first side and gradually widening to a wide end portion on a second side, the drain conductor having a narrow end portion on the second side and gradually widening to a wide end portion on the first side, the gradual widening for increasing cross sectional areas of the source conductor and drain conductor in accordance with an increase in a magnitude of current flow, the current flow being generated by activation of the gate structure.

2. The device as recited in claim 1, wherein the source conductor and drain conductor are substantially trapezoidal in shape.

3. The device as recited in claim 1, wherein the gate structure has a length sufficient to generate currents in the source conductor and drain conductor of between about 300 mA to about 5 A.

4. The device as recited in claim 1, wherein the device includes a silicon-on insulator structure.

5. The device as recited in claim 4, wherein the device is operable at temperatures above about 175 degrees Celsius.

6. The device as recited in claim 1, wherein the source conductor and drain conductor include aluminum.

7. The device as recited in claim 1, wherein the wide end portions correspond to one of current flow entrance regions and current flow exit regions.

8. A semiconductor device comprising:
    a plurality of alternating source and drain regions, each of the plurality of regions disposed on opposite sides of a gate structure;
    a plurality of source and drain conductors, each conductor being electrically connected to one of a corresponding source region and a corresponding drain region;
    the source and drain conductors having a same gradually widening shape as the corresponding source regions and the corresponding drain regions, the gradually widening shape for drain regions widening in a first direction and the gradually widening shape for source regions widening in a second direction opposite the first direction, the gradually widening shape for increasing cross sectional areas of the source and drain conductors in accordance with an increase in a magnitude of current flow, the current flow being generated by activation of the gate structure.

9. The device as re cited in claim 8, wherein the gradual widening shape of the source and drain conductors includes a substantially trapezoidal shape.

10. The device as recited in claim 8, wherein the gate structures have a length sufficient to generate currents in the source and drain conductors of between about 300 mA to about 5 A.

11. The device as recited in claim 8, wherein the device includes a silicon-on-insulator structure.

12. The device as recited in claim 11, wherein the device is operable at temperatures above about 175 degrees Celsius.

13. The device as recited in claim 8, wherein the source and drain conductors include aluminum.

14. The device as recited in claim 8, wherein the wide end portions correspond to one of current flow entrance regions and current flow exit regions.

15. A silicon-on-insulator semiconductor device comprising:

a plurality of alternating source and drain regions, each of the plurality of regions disposed on opposite sides of a gate structure;

a plurality of source and drain conductors, each conductor being electrically connected to one of a corresponding source region and a corresponding drain region by a contact, each source and drain conductor being separated by the gate structures; and the source and drain conductors having a substantially constant thickness and having a same gradually widening shape as the corresponding source regions and the corresponding drain regions, the gradually widening shape for drain regions widening in a first direction and the gradually widening shape for source regions widening in a second direction opposite the first direction, the gradually widening shape for increasing cross sectional areas of the source and drain conductors in accordance with an increase in a magnitude of current flow, the current flow being generated by activation of the gate structure.

16. The device as recited in claim 15, wherein the gradual widening shape of the source and drain conductors includes a substantially trapezoidal shape.

17. The device as recited in claim 15, wherein the gate structures have a length sufficient to generate currents in the source and drain conductors of between about 300 mA to about 5 A.

18. The device as recited in claim 15, wherein the device is operable at temperatures above about 175 degrees Celsius.

19. The device as recited in claim 15, wherein the source and drain conductors include aluminum.

20. The device as recited in claim 15, wherein the wide end portions correspond to one of current flow entrance regions and current flow exit regions.

* * * * *